(12) United States Patent
Orcutt et al.

(10) Patent No.: US 7,471,032 B1
(45) Date of Patent: Dec. 30, 2008

(54) SHOCK RESISTANT AND MODE MIXING RESISTANT TORSIONAL HINGED DEVICE

(75) Inventors: John W. Orcutt, Richardson, TX (US); Carter Bruce Simpson, Celina, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/758,411

(22) Filed: Jun. 5, 2007

(51) Int. Cl.
*H01L 41/00* (2006.01)

(52) U.S. Cl. ............ 310/332; 359/213; 359/214; 359/224

(58) Field of Classification Search .......... 310/332; 359/213, 214, 198, 199, 224; 347/260; 248/371, 248/919
See application file for complete search history.

(56) References Cited

U.S. PATENT DOCUMENTS 6,803,938 B2 * 10/2004 Turner ............ 347/237
2005/0078169 A1 * 4/2005 Turner ............ 347/260

* cited by examiner

*Primary Examiner*—Thomas M. Dougherty
*Assistant Examiner*—Bryan P Gordon
(74) *Attorney, Agent, or Firm*—William B. Kempler; W. James Brady, III; Frederick J. Telecky, Jr.

(57) ABSTRACT

A shock resistant and mode mixing resistant assembly for oscillating a device such as a MEMS mirror around a pivot axis by means of two pairs of piezoelectric elements or towers is provided. The resistance to mechanical shock and mode mixing is accomplished by mounting the broad faces or width of each piezoelectric element in a chevron shape so that the broad faces or width dimensions are not in parallel or aligned with each other. Mounting the piezoelectric elements so that the broad faces or width dimensions are at a 15 degree angle with respect to a line perpendicular to the pivot axis has been found to be especially effective.

13 Claims, 5 Drawing Sheets

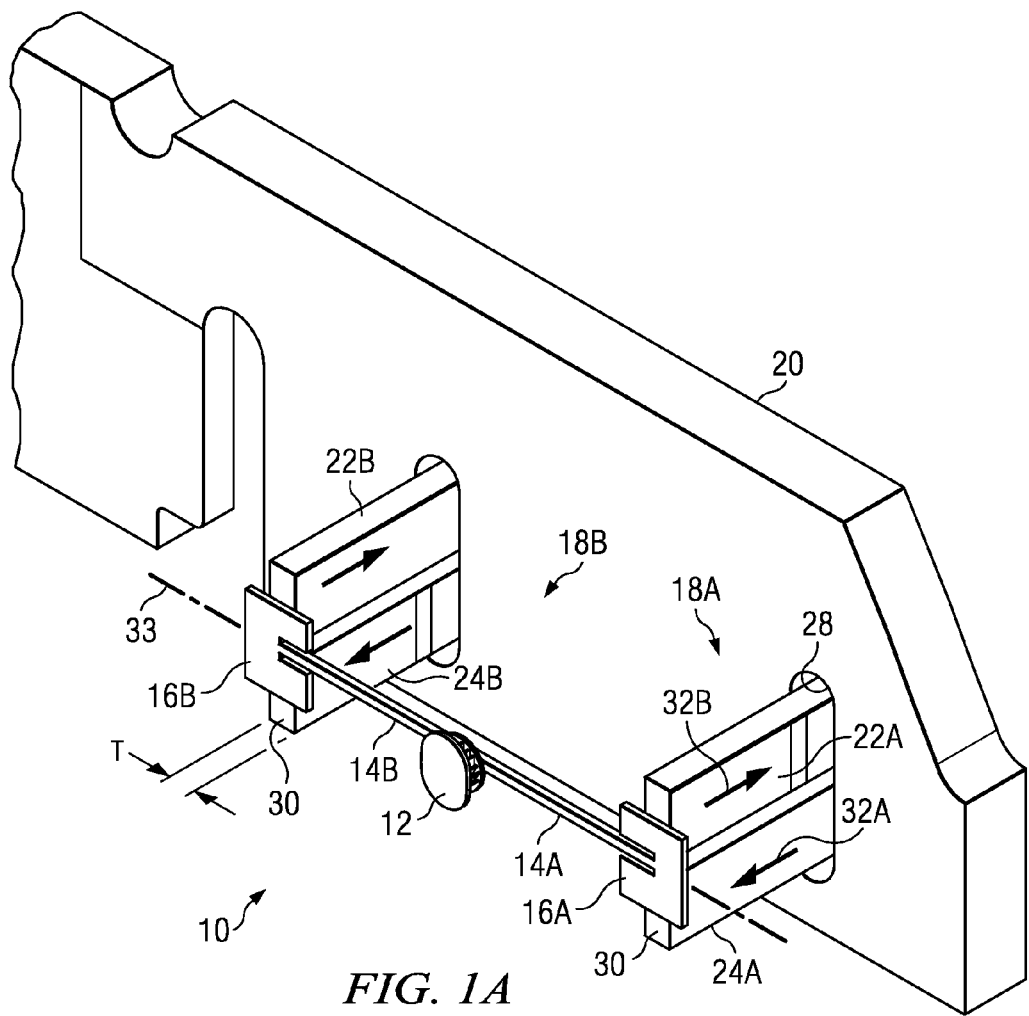
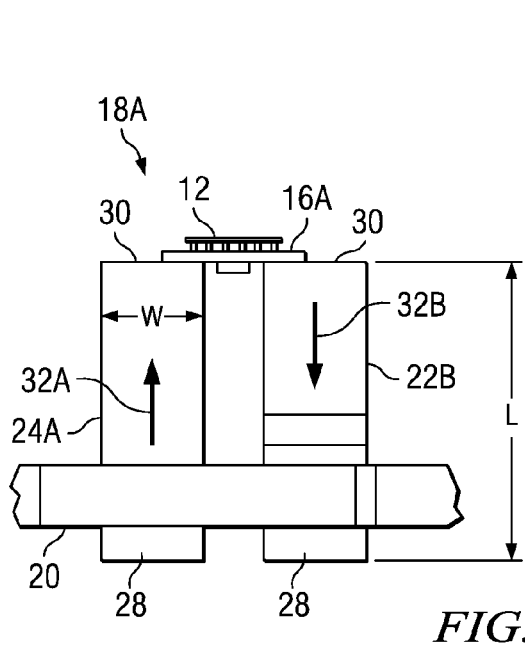
FIG. 1B
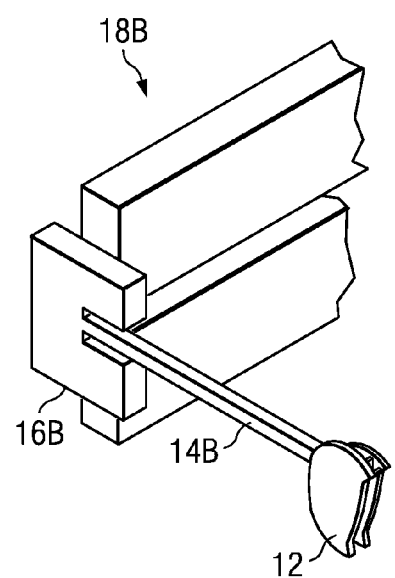
FIG. 1C
FIG. 1A

SHOCK RESISTANT AND MODE MIXING RESISTANT TORSIONAL HINGED DEVICE

TECHNICAL FIELD

The present invention relates generally to the field of torsional hinged Micro Electro Mechanical Systems (MEMS) oscillating devices. More particularly, the invention relates to a shock resistant and mode mixing resistant actuator structure for driving the torsional hinged device oscillations at a resonant frequency.

BACKGROUND

The use of rotating polygon scanning mirrors in laser printers to provide a beam sweep or scan of the image of a modulated light source across a photoresisted medium, such as a rotating drum, is well known. More recently, there have been efforts to use a much less expensive flat member with a single reflective surface, such as a MEMS resonant oscillating mirror, to provide the scanning beam. Other devices using resonant oscillating members, other than mirrors, may also benefit from this invention. These torsional hinged resonant scanning devices provide excellent performance at a very advantageous cost. Several techniques are available for driving the torsional hinged resonant scanning device, but the use of piezoelectric elements has been found to be both effective and inexpensive. However, as is the case with almost every technology using piezoelectric driving elements has its own set of problems. More specifically, the long thin piezoelectric elements used to excite the rotational scanning of resonant devices such as mirror assemblies are susceptible to mode mixing and mechanical shock.

Therefore, rugged methods and structures that facilitate the use of piezoelectric driving elements without a corresponding increase in complexity or cost would be advantageous.

SUMMARY OF THE INVENTION

These problems of mode mixing and mechanical shock are generally solved or circumvented, and technical advantages are generally achieved, by the embodiments of the present invention which provide a shock resistant and mode mixing resistant assembly using piezoelectric elements to provide resonant oscillations to a torsional hinged device. The assembly is comprised of first and second elongated members such as at least one torsional hinge for supporting an oscillating functional member such as a MEMS mirror along a pivot axis. Each of the elongated members (including at least one torsional hinge) extends from an oscillating functional member to an end portion. The end portion of the at least one torsional hinge is supported and attached to a pair of piezoelectric elements that extend between the end portion of the torsional hinge and a support base. Each piezoelectric element is typically a long thin parallelepiped or brick shaped structure having a thickness dimension, a width dimension, and a length or height dimension, and each piezoelectric element of the pair of elements is mounted on end to a support base such that the length or height dimension extends perpendicularly and away from the support base and so that the width dimension of one of the piezoelectric elements is not parallel to the width dimension of the other one of the pair of piezoelectric elements. Mounting piezoelectric elements so that the width dimension forms a 15 degree angle with a line perpendicular to the pivot axis of the oscillation device has been found to be particularly effective.

The foregoing has broadly outlined the features of the present invention in order that the detailed description of the invention that follows may be better understood. Additional features and advantages will be described hereinafter, which form the subject of the claims of the invention. It should be appreciated by those skilled in the art that the conception and specific embodiments disclosed may be readily utilized as a basis for modifying or designing other structures or processes for carrying out the same purpose of the present invention. It should also be realized by those skilled in the art that such constructions do not depart from the spirit or scope of the invention as set forth in the appended claims.

BRIEF DESCRIPTION OF THE DRAWINGS

For a more complete understanding of the present invention, and the advantages thereof, reference is made to the following descriptions taken in conjunction with the accompanying drawings, in which:

FIGS. 1A-1B are a perspective view and an end view, respectively, of a piezoelectric driven resistant oscillating device that is susceptible to both mechanical shock and mode mixing;

FIGS. 1C-1D show perspective views of alternative embodiments with only one torsional hinge;

DETAILED DESCRIPTION OF ILLUSTRATIVE EMBODIMENTS

The making and using of the described embodiments are discussed in detail below. It should be appreciated, however, that the present invention provides many applicable inventive concepts that can be embodied in a wide variety of specific contexts. The specific embodiments discussed are illustrative of specific ways to make and use the invention, and should not limit the scope of the invention.

Figure 1D:
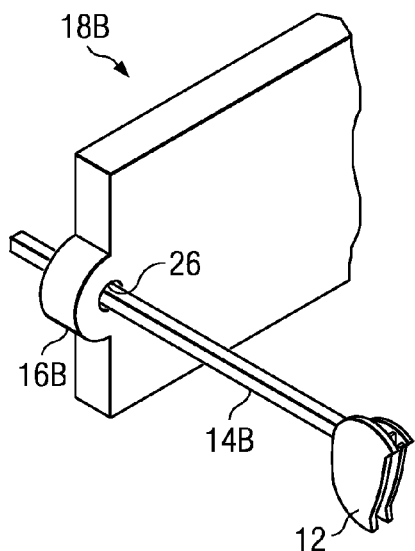

Referring now to FIGS. 1A and 1B there is illustrated a piezoelectric driven torsional hinged device 10, such as a mirror 12 that is not resistant to mechanical shock or cross-modal effects. As shown, the device 10 comprises first and second elongated members 14a and 14b that are attached to and extend from the oscillating device or mirror 12 to end portions 16a and 16b, respectively. At least one, and preferably both, of the elongated members 14a and 14b comprise torsional hinges. The end portions 16a and 16b are in turn supported by structures 18a and 18b, respectively, which extend between the base support 20 and the end portions 16a and 16b of the resonant mirror. At least one of the structures 18a and 18b, and preferably both, comprise a pair of piezoelectric devices or towers such as elements 22a and 24a that comprise structure 18a. Although, as mentioned above, it is preferable that both structures 18a and 18b comprise a pair of piezoelectric elements. However, structure 18b may simply comprise a non-piezoelectric mechanical support members, or could comprise a pair of piezoelectric elements that are not electrically connected as shown in FIG. 1C. Also as was mentioned above, it is preferred that both elongated members 14a and 14b are torsional hinges. However, it is possible that the end portion 16b of elongated member 14b simply be supported by a receiving aperture 26 as shown in FIG. 1D and not provide torsional action to the device 10. Although these alternate embodiments may also benefit from the teaching of the present invention, the remaining discussion will be with respect to an oscillating device that comprises two pairs of piezoelectric elements and two torsional hinges.

Referring again to FIGS. 1A and 1B, it is seen that the typical piezoelectric elements or towers are a thin elongated parallelepiped having a first end 28 mounted or soldered to a substrate or base support 20 and a second end 30 attached to the end portions of 16a and 16b of the torsional hinges 14a and 14b. Each of the piezoelectric elements have a thickness dimension "T," a width dimension "W" and a length or height dimension "L." The piezoelectric elements are arranged side by side in pairs with the large faces (W dimension) of each pair facing each other. A pair of piezoelectric elements or towers are electrically connected so that each one of the pair operates 180 degrees out of phase with the other to create an up and down pumping action as indicated by the large directional arrows 32a and 32b. This pumping action in turn causes the oscillating mirror 12 or other functional device to oscillate at its resonant frequency around pivot axis 33. It should also be noted that when two pairs of piezoelectric elements or towers, such structures 18a and 18b are used, elements opposite each other and attached to the end portion of different torsional hinges operate in phase.

Figure 2A:
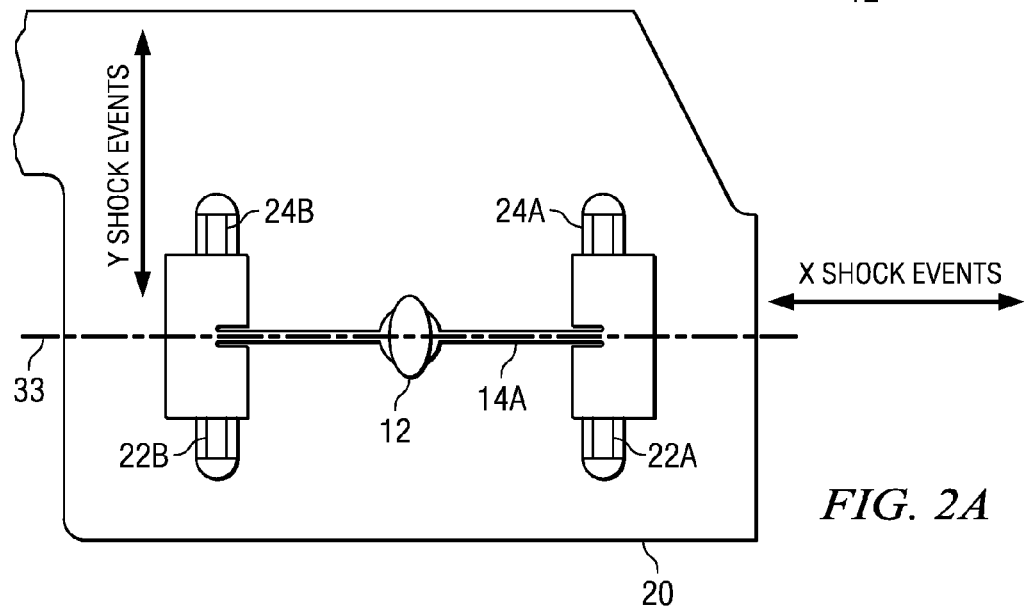
FIGS. 2A-2B are a top view and a side view, respectively, of the device of FIG. 1A illustrating the effects of mechanical shock in the X, Y and Z directions on the oscillating device.
Figure 2B:
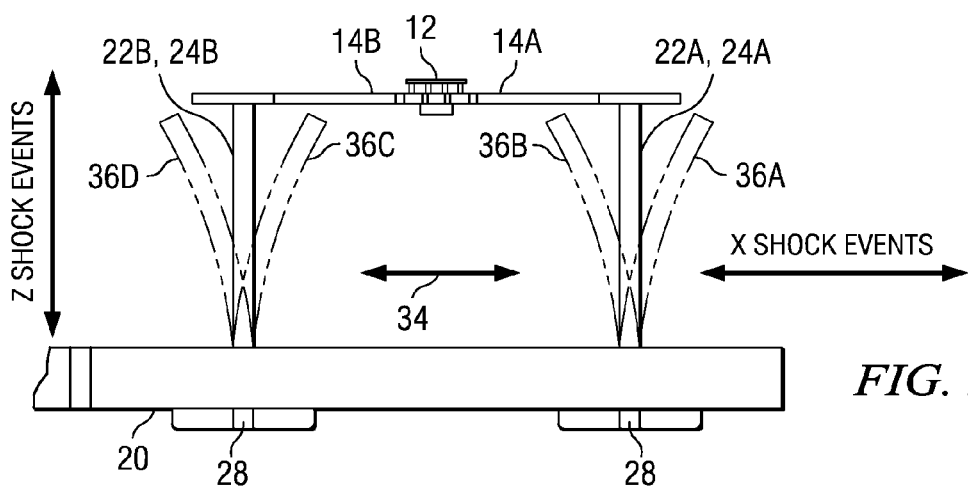

Referring to FIGS. 2A and 2B, the effect of mechanical shock received along axes X, Y and Z of the device of FIG. 1A will be discussed. Parts of the device in FIGS. 2A and 2B that are common with the device of FIG. 1A will carry the same reference numbers. As will be appreciated, there is significant resistance to mechanical shock along the Y and Z axes and, for most situations therefore, shock along the Y and Z axes is not a concern. However, because the piezoelectric elements 22a, 22b, 24a, and 24b are very thin, mechanical shock along the X axis can snap or break the piezoelectric elements at end 28 where they are attached to the base support 20. Large double headed arrow 34 and dotted lines 36a, 36b, 36c, and 36d illustrate the direction of a shock event along the X axis and the resulting deflection of the piezoelectric elements respectively. An arrangement that can resist mechanical shock in the X direction would be very advantageous.

Figure 3A:
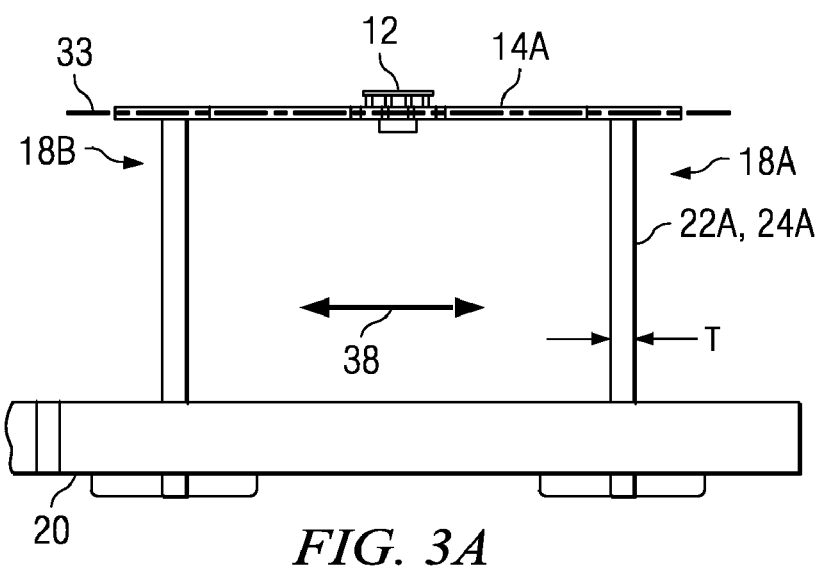
FIGS. 3A-3B are an end view and a side view, respectively, of the device of FIG. 1A illustrating cross-modal effects on the oscillating device.
Figure 3B:
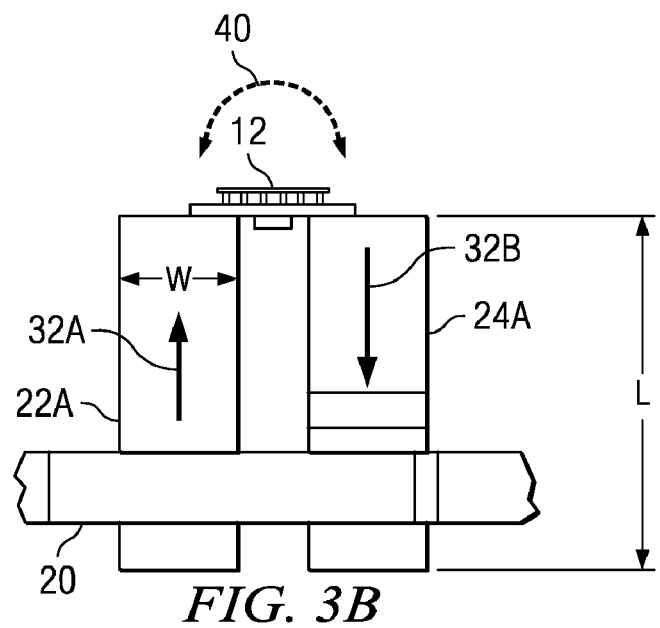

Referring to FIG. 3A, cross-modal effects are discussed. As was discussed above, the piezoelectric element of a pair of elements or towers extends and contracts out of phase as shown by arrows 32a and 32b, which causes the oscillating device or mirror to oscillate or rotate at the same or resonant frequency around pivot axis 33 as the piezoelectric elements contract and extend. Unfortunately, various packages and assembly processes add imbalances to the operation of the device which in turn causes other modes of the assembly to be excited. This may result in one or more other resonant modes, such as indicated by arrow 38, to be mixed with the intended rotational mode indicated by arcuate arrow 40. Since such mixing of the mode causes noise, loss of rotation and out of phase oscillations, a means for reducing mode mixing is also desirable.

It has been discovered that one source of these problems is that each element of the pair of piezoelectric elements or towers is located directly opposite the other. This arrangement allows the piezoelectric elements or towers to sway back and forth. The swaying may be together or out of phase with each other.

Figure 4A:
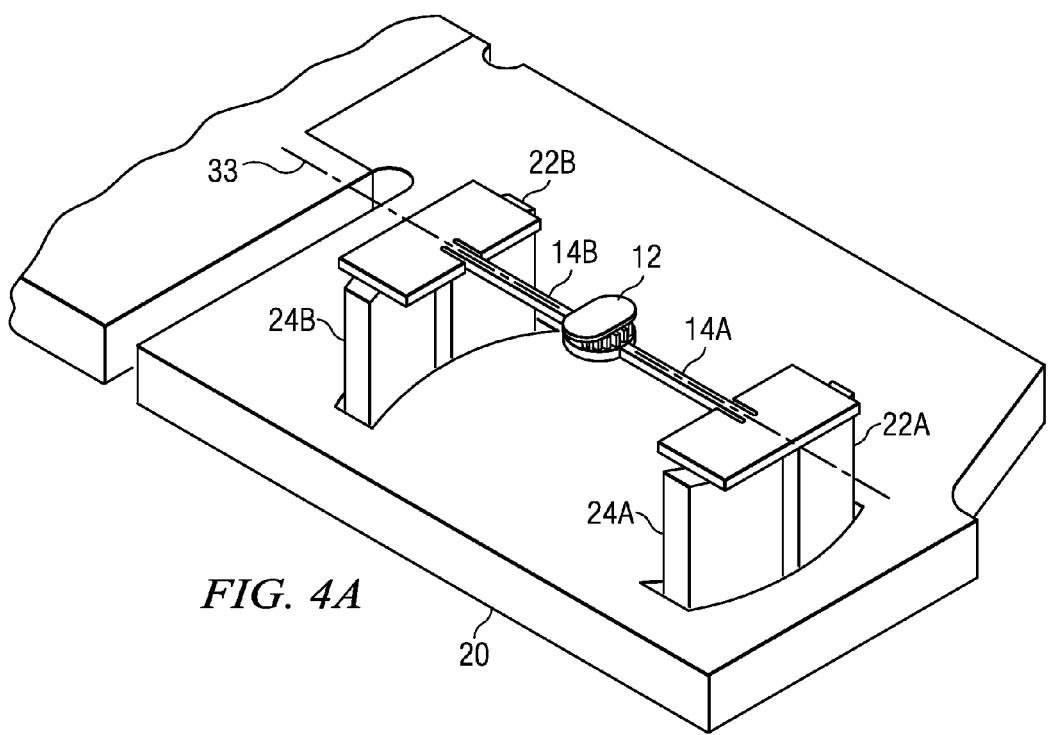
FIGS. 4A-4B are a perspective view and a top view respectively of a piezoelectric driven torsional hinged oscillating device incorporating the present invention.
Figure 4B:
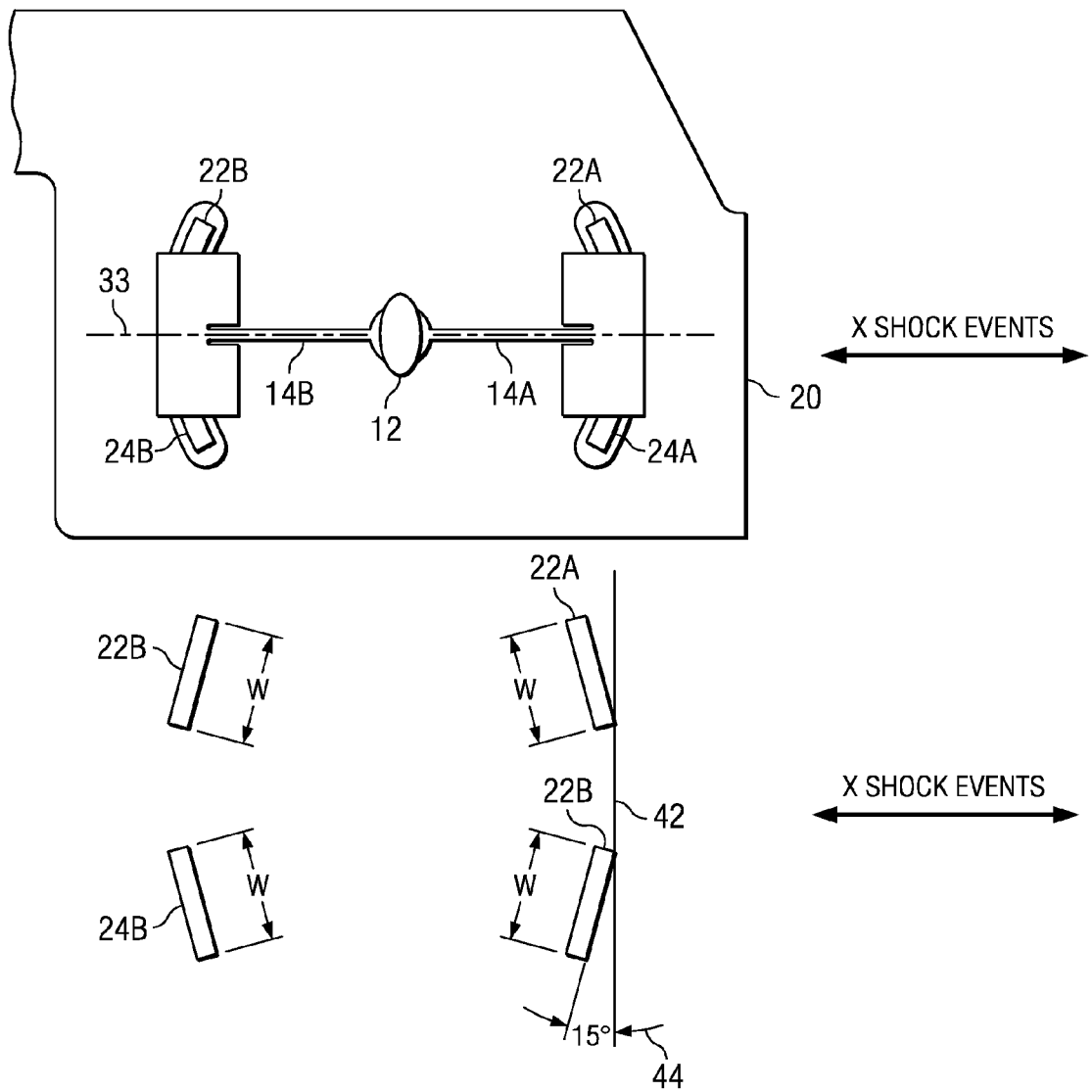

Therefore, referring now to FIGS. 4A and 4B, there is illustrated an arrangement of the piezoelectric elements or towers that stiffens the assembly against swaying, which in turn increases the resistance to both shock and mode mixing. As shown, the two elements of each pair of piezoelectric elements or towers are arranged to form a chevron shape. That is, the width dimension W of piezoelectric elements 22a and 22b are not aligned with each other and are not parallel to each other. A preferred arrangement has been found in locating a pair of the piezoelectric elements so that each one in the pair is at a 15 degree angle with a line 42 perpendicular to the pivot axis 33 and lying in the same plane as the pivot axis 33. It is also noted that the resistance against swaying is decreased as the angle is decreased and that the most dramatic reduction of the swaying is at very low angles. Thus, although an angle of 15 degrees has been found to be particularly useful, almost any angle 44 above zero provides improved resistance.

Although the present invention and its advantages have been described in detail, it should be understood that various changes, substitutions, and alterations can be made herein without departing from the spirit and scope of the invention as defined by the appended claims.

Moreover, the scope of the present application is not intended to be limited to the particular embodiments of the structure, methods, and steps described in the specification. As one of ordinary skill in the art will readily appreciate from the disclosure of the present invention, such structures, methods, and steps presently existing or later to be developed, that perform substantially the same function or achieve substantially the same result as the corresponding embodiments described herein may be utilized according to the present invention. Accordingly, the appended claims are intended to include within their scope such structure, methods, and steps.

What is claimed is:

1. An assembly for oscillating a device around a pivot axis comprising:

first and second elongated members for supporting said oscillating device attached to and extending between said oscillating device and end portions along said pivot axis, said first one of said elongated members comprising a first torsional hinge;

a first pair of piezoelectric elements extending between a support base and the end portion of said first torsional hinge, each of said first pair having a thickness along a first dimension, a width along a second dimension and a height along a third dimension, said third dimension extending perpendicular from said support base to said first torsional hinge and said first pair of piezoelectric elements positioned such that the width of a first one of said first pair is not parallel to the width of the other one of said first pair; and a structure extending from said support base for supporting said end portion of said second elongated member.

2. The assembly of claim 1 wherein said second elongated member comprises a second torsional hinge and said structure comprises a second pair of piezoelectric elements.

3. The assembly of claim 1 wherein each one of said first pair expands and contracts along said third dimension.

4. The assembly of claim 3 wherein one piezoelectric element of said first pair expands and contracts out of phase with the piezoelectric element of said pair.

5. The assembly of claim 3 wherein said oscillating device oscillates at a resonant frequency and said piezoelectric elements expands and contacts at said resonant frequency.

6. A shock resistant torsional hinged scanning mirror assembly comprising:

a resonant scanning mirror having first and second torsional hinges, each of said torsional hinges extending between a mirror portion and an attaching member, said scanning mirror oscillating about a pivot axis extending along said torsional hinges;

a support base; and first and second pairs of piezoelectric elements having a thickness, a width and a length, and one each of said pairs extending between said support base and one of said attaching members of said torsional hinged scanning mirror, each of said piezoelectric elements contracting and expanding along an axis aligned with said length and each of said piezoelectric elements mounted to said support base such that said width is at an acute angle with a line in said plane of said pivot axis and that is perpendicular to said pivot axis.

7. The scanning mirror assembly of claim 6 wherein said acute angle is approximately 15 degrees.

8. The scanning mirror assembly of claim 6 wherein each one of said pairs of piezoelectric elements expands and contracts along said length.

9. The scanning mirror assembly of claim 8 wherein one piezoelectric element of each of said pairs expands and contracts out of phase with the other piezoelectric element of each of said pairs.

10. The scanning mirror assembly of claim 8 wherein said scanning mirror has a resonant frequency, and said piezoelectric elements expand and contract to said resonant frequency.

11. A shock resistant method for mounting a torsional hinged oscillating device comprising the steps of:

providing a torsional hinged device having a pivot axis and an end pattern for mounting a support base and at least one pair of piezoelectric elements having a thickness along a first axis, a width along a second axis and a length along a third axis;

attaching a first end of each one of said at least one pair of said piezoelectric elements pair to said support base such that said length or said third axis extends perpendicular to said support base and attaching a second end to an end portion of said torsional hinged device; and positioning said piezoelectric elements so that said second axis of one of said at least one pair is not parallel with or aligned with the second axis of the other one of said at least one pair.

12. The method of claim 11 wherein said positioned piezoelectric elements form an acute angle with a line perpendicular to and in the same plane as said pivot axis of said torsional hinged device.

13. The method of claim 12 wherein said acute angle is approximately 15 degrees.

* * * * *